United States Patent [19]
Bernard

[11] Patent Number: 6,126,258
[45] Date of Patent: Oct. 3, 2000

[54] SYSTEM AND METHOD FOR INTERFACING SIGNALS WITH A PROCESSING ELEMENT

[75] Inventor: Christopher T Bernard, Colo Springs, Colo.

[73] Assignee: Agilent Technologies, Palo Alto, Calif.

[21] Appl. No.: 09/249,450

[22] Filed: Feb. 12, 1999

[51] Int. Cl.$^7$ .............................................. H03K 19/0175
[52] U.S. Cl. ................................. 328/82; 326/81; 326/63
[58] Field of Search ................................. 326/80, 81, 82, 326/63, 68

[56] References Cited

U.S. PATENT DOCUMENTS

| | | | |
|---|---|---|---|
| 4,527,079 | 7/1985 | Thompson | 326/63 |
| 5,013,941 | 5/1991 | Jansson | 326/63 |
| 5,534,801 | 7/1996 | Wu et al. | 327/72 |
| 5,910,734 | 6/1999 | Manning | 326/81 |
| 5,952,848 | 9/1999 | Morris | 326/81 |

*Primary Examiner*—Michael Tokar
*Assistant Examiner*—Don Phu Le

[57] ABSTRACT

In general, the present invention is a system and method for interfacing signals with processing elements, such as microprocessors. The present invention utilizes a processing element, an electrical connection, a resistive device, a current sink, a first diode, a second diode, and a buffer. The electrical connection is coupled to the processing element, which is associated with an operating voltage. The resistive device is coupled to the electrical connection, and the first diode is coupled to the electrical connection and the current sink. An anode end of the first diode is coupled to the electrical connection between the resistive device and the processing element, and a cathode end of the first diode is coupled to the current sink. The buffer is coupled to the processing element, which transmits a voltage corresponding with the operating voltage of the processing element to the buffer. The second diode couples the buffer to the current sink. The voltage of the signal transmitted to the buffer is reduced by the second diode such that the voltage at the cathode end of the first diode corresponds to the operating voltage of the processing element minus the voltage drop across the first diode. As a result, the voltage of the signals transmitted across the electrical connection are prevented from exceeding the operating voltage of the processing element.

21 Claims, 6 Drawing Sheets

SYSTEM AND METHOD FOR INTERFACING SIGNALS WITH A PROCESSING ELEMENT

BACKGROUND OF THE INVENTION

1. Field of the Invention

The present invention generally relates to data communication and, in particular, to a system and method for controlling voltages of signals interfaced with a processing element.

2. Related Art

Most microprocessors that are embodied in integrated circuit microchips (chips) include a debug port for interfacing signals with the core of the microprocessor chip. As known in the art, the core of a microprocessor chip is a portion of the microprocessor chip that executes instructions and processes data. The debug port electrically connects external connections directly to the components of the core. Typically, the external connections transmit signals to and from an emulator, which communicates with the microprocessor core.

Most microprocessor cores operate at standard TTL (transistor-transistor logic) or CMOS (complementary metal-oxide semiconductor) voltage levels. Furthermore, a buffer usually separates the debug port from the emulator. Since many emulators communicate signals having voltages higher than those compatible with standard TTL or CMOS, the buffer is designed to translate the signals communicated between the emulator and the core to appropriate voltages. For example, the buffer receives signals from the emulator and translates the voltages of these signals into voltages compatible with the core before transmitting the signals to the debug port. Conversely, the buffer receives signals from the debug port and translates the voltages of these signals into voltages compatible with the emulator before transmitting the signals to the emulator. The buffer is usually an integrated circuit (IC) designed to implement the aforementioned functionality.

As a result of improvements in technology, especially in the area of microfabrication production, the operating voltages of microprocessor cores are being reduced. In fact, the operating voltages of some microprocessor cores are now below standard TTL and CMOS levels. As a result, current buffer designs are inadequate to interface signals with these microprocessor cores having low operating voltages. In this regard, current buffers compatible with TTL or CMOS levels fail to reduce the voltages of the signals received from the emulator to a low enough voltage to prevent damage to the core. In addition, these buffers also misinterpret many logical high signals output from the core as logical low signals because the voltages of these signals are not high enough to qualify as logical high, when the buffer is comparing the signals to TTL or CMOS levels.

Thus, a heretofore unaddressed need exists in the industry for providing a system and method of interfacing signals with a core of a microprocessor when the core is operating at voltages below standard TTL or CMOS voltages.

SUMMARY OF THE INVENTION

The present invention overcomes the inadequacies and deficiencies of the prior art as discussed herein. The present invention provides a system and method for interfacing signals with processing elements, including processing elements that have operating voltages below standard TTL or CMOS voltages.

Generally, the present invention utilizes a processing element, a first connection, a resistive device, a current sink, a first diode, a second diode, and a buffer. The first connection is coupled to the processing element, which is associated with an operating voltage. The resistive device is coupled to the first connection, and the first diode is coupled to the first connection and the current sink. An anode end of the first diode is coupled to the first connection between the resistive device and the processing element, and a cathode end of the first diode is coupled to the current sink. The buffer is coupled to the microprocessor, which transmits a voltage corresponding with the operating voltage of the processing element to the buffer. The second diode couples the buffer to the current sink. The voltage of the signal transmitted to the buffer is reduced by the second diode such that the voltage at the cathode end of the first diode corresponds to the operating voltage of the processing element minus the voltage drop across the first diode. As a result, the voltage of the signals transmitted across the first connection are prevented from exceeding the operating voltage of the processing element.

In accordance with another feature of the present invention, a second connection is coupled to the processing element and receives signals transmitted from the processing element. A voltage divider is configured to receive a voltage signal corresponding with the operating voltage of the processing element and to produce a reference voltage signal based on the received voltage signal. A comparator is coupled to the voltage divider and to the second connection. The comparator amplifies signals received from the second connection based on the values of the signals received from the second connection and based on a value of the reference voltage signal.

In accordance with another feature of the present invention, the current sink further comprises an operational amplifier that has a first input terminal, a second input terminal, and an output terminal. The first input terminal is coupled to the second diode, and the second input terminal is coupled to the output terminal. Furthermore, the output terminal is also coupled to the cathode end of the first diode.

In accordance with another feature of the present invention, the buffer includes an operational amplifier having a third input terminal, a fourth input terminal, and a second output terminal. The third input terminal is coupled to the processing element, and the fourth input terminal is coupled to the second output terminal. Furthermore, the second output terminal is also coupled to the second diode.

The present invention can also be viewed as providing a method for interfacing signals with processing elements. Briefly described, the method can be broadly conceptualized by the following steps: establishing a threshold voltage for a processing element; transmitting a first signal to the processing element via a first connection; and preventing a first voltage of the first signal from exceeding the threshold voltage when the first signal is being transmitted via said first connection. The preventing step includes the following steps: passing current associated with the first signal through a first diode; dissipating the current; transmitting a second signal having a voltage corresponding to the threshold voltage through a second diode; and establishing a voltage of a cathode end of the first diode via the second signal after transmitting the second signal through said second diode.

The present invention has many advantages, a few of which are delineated hereafter, as mere examples.

An advantage of the present invention is that signals can be easily interfaced with processing elements operating at voltages below standard TTL and/or CMOS voltages.

Another advantage of the present invention is that it is simple in design and easily implemented.

Another advantage of the present invention is that the signals input into a processing element can be clamped at (i.e., prevented from exceeding) various voltages.

Another advantage of the present invention is that the signals input into a processing element can be clamped at a threshold voltage that tracks the operating voltage of the processing element.

Other features and advantages of the present invention will become apparent to one skilled in the art upon examination of the following detailed description, when read in conjunction with the accompanying drawings. It is intended that all such features and advantages be included herein within the scope of the present invention, as is defined by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE INVENTION

Figure 1:
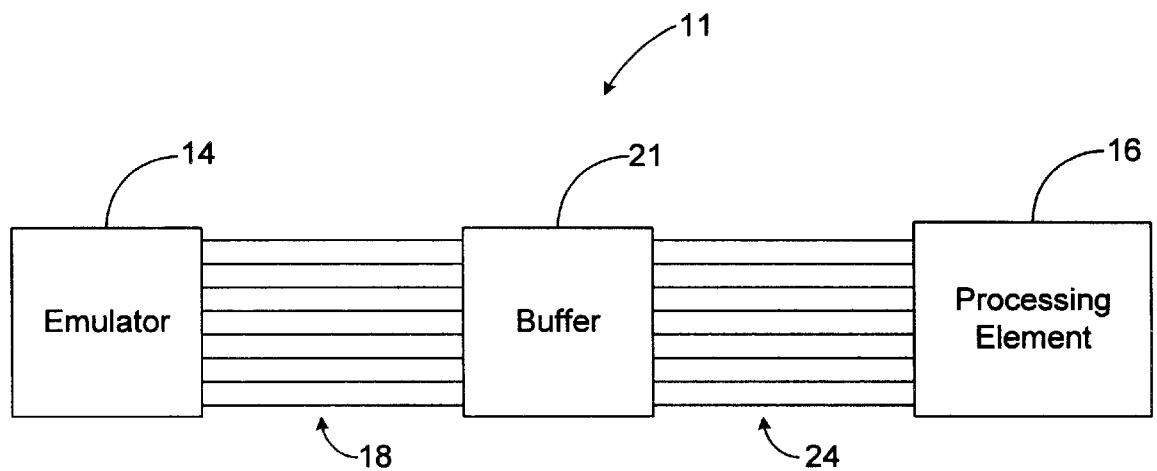
FIG. 1 is a block diagram illustrating a conventional system for interfacing signals between an emulator and a processing element.

FIG. 1 depicts a conventional system 11 for interfacing signals between an emulator 14 and a processing element 16, such as a microprocessor, for example. Referring to FIG. 1, a plurality of electrical connections 18 are coupled to the emulator 14 and a buffer 21, and a plurality of electrical connections 24 are coupled to the buffer 21 and the processing element 16. The buffer 21 is typically an integrated circuit designed to convert the voltages of the signals on connections 18 and 24 to acceptable levels, and the processing element 16 is any device that process the data transmitted across connections 24.

Figure 2:
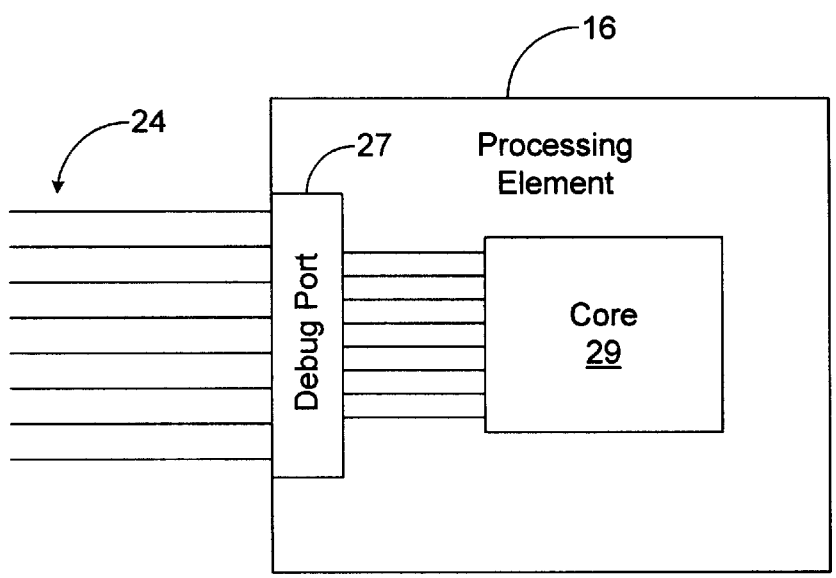
FIG. 2 is a block diagram illustrating the processing element of FIG. 1.

The connections 24 are usually coupled to a debug port 27, which interfaces the signals on connections 24 with a core 29 of the processing element 16, as shown by FIG. 2. The core 29 usually operates at voltages compatible with TTL (transistor—transistor logic) or CMOS (complementary metal-oxide semiconductor), which usually range from about 2.5 volts to about 5 volts. The voltages of the signals on connections 24 should be compatible with these levels since the signals on connections 24 are interfaced directly with the core 29 via the debug port 27.

However, the emulator 14 often operates at voltages higher than the TTL or CMOS voltages utilized by the core 29. Therefore, the buffer 21 is designed to receive the signals transmitted across connections 18 by the emulator 14 and to convert the voltages of these signals into voltages compatible with the core 29 before transmitting the signals across connections 24. The buffer 21 is also designed to receive the signals transmitted across connections 24 by the core 29 and to convert the voltages of these signals into voltages compatible with the emulator 14 before transmitting the signals across connections 18. As a result of the conversions performed by the buffer 21, the signals received by the emulator 14 and the core 29 have acceptable voltages so that the emulator 14 and the core 29 can appropriately process the received signals.

However, due to improvements in technology, especially in the area of microfabrication production, it is possible for the core 29 (FIG. 2) of some processing elements 16 to operate at voltages less than standard TTL and CMOS voltages. For example, it is possible for some cores 29 to operate at voltages as low as approximately 0.8 volts. Therefore, current designs of the buffer 21 are inadequate to interface the emulator 14 with the debug port 27 (FIG. 2) of the processing element 16 when the core 29 is operating at voltages below TTL or CMOS voltages. Furthermore, designing and producing suitable buffers 21 for converting signals on connection 18 to voltages below standard TTL or CMOS voltages could take many months or even years. It is desirable to have a circuit capable of interfacing the emulator 14 with the debug port 27 of the processing element 16 when the buffer 21 is inadequate for interfacing signals with the core 29 of processing element 16.

Figure 3:
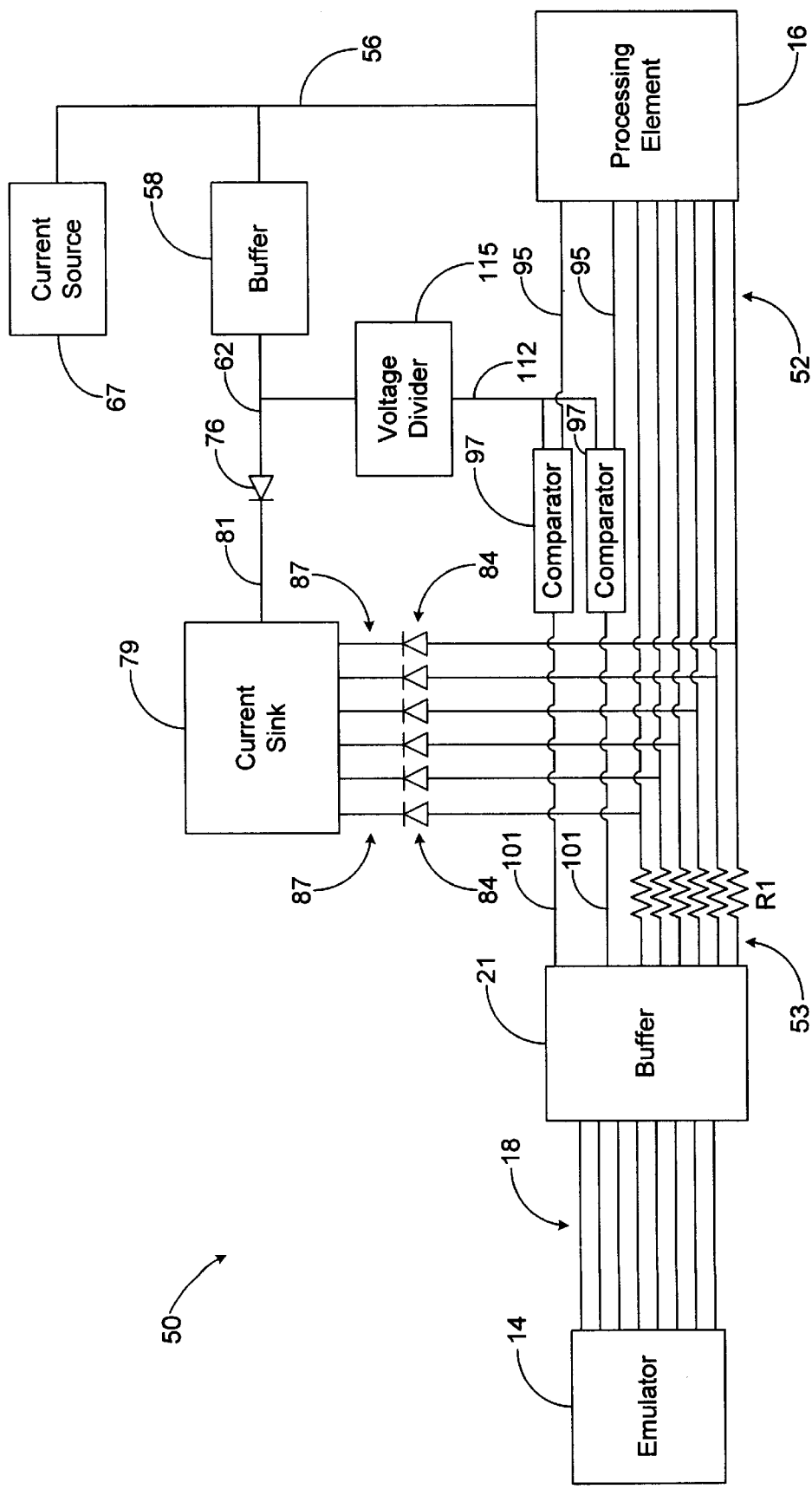
FIG. 3 is a block diagram illustrating a system for interfacing signals between the emulator and the processing element in accordance with the present invention.

FIG. 3 depicts a system 50 implementing the principles of the present invention. In general, the system 50 enables interfacing of signals with the processing element 16 for a variety of core operating voltages, including voltages lower than standard TTL and CMOS levels. Therefore, the emulator 14 may be interfaced with the debug port 29 (FIG. 2) of the processing element 16 when the core 29 is operating at voltages below standard TTL and CMOS voltages.

Referring to FIG. 3, at least one connection 52 is coupled to a resistor R1 (or other type of device having electrical resistance) and to the debug port 27 (FIG. 2) of the processing element 16, although it is possible for each of the connections 52 to be coupled to other ports of the processing element 16 in other embodiments. Each connection 52 is utilized to transmit signals to the processing element 16.

Connections 53 couple each resistor R1 to the buffer 21. The buffer 21 is designed to interface the signals transmitted from the emulator 14 with connections 53 via conventional buffering techniques. The buffer 21 is a well known device and is preferably configured to lower the voltage of the signals received from connection 18. However, it is not necessary for buffer 21 to lower the voltage of the signals transmitted from the emulator 14, and other configurations of the buffer 21 are possible. In addition, the buffer 21 may be located separate from the emulator 14, as shown by FIG. 3, or may be included within the emulator 14. Furthermore, the emulator 14 does not form a necessary part of the present invention, and the buffer 21 may interface the processing element 16 with other devices, if desired.

Connection 56 couples the processing element 16 to a buffer 58. The connection 56 is preferably coupled to a terminal of the processing element 16 having a voltage corresponding with the operating voltage of the core 29. For example, the value of the voltage applied to the connection 56 by the processing element 16 is preferably equal to the value of the operating voltage of the core 29 in the preferred embodiment. Therefore, it is desirable that the voltage values of the signals transmitted by connections 52 be equal to or less than the voltage value of the signal transmitted by connection 56. In other words, the voltage value of the signal transmitted by connection 56 represents an upper threshold value for the signals transmitted by connection 52.

Figure 4:
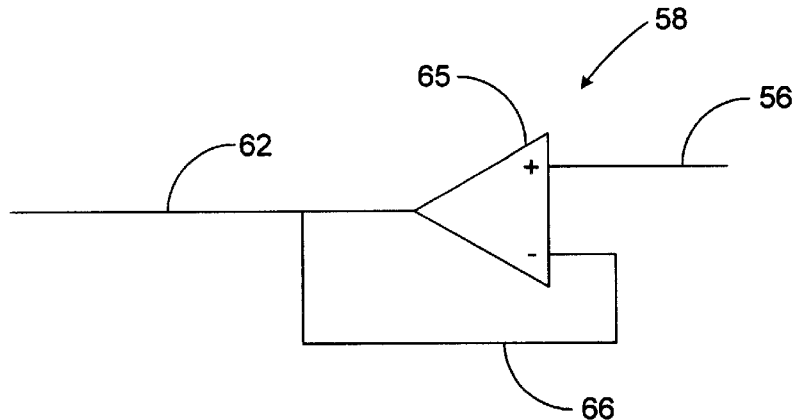
FIG. 4, is a circuit diagram of a buffer depicted in FIG. 3.

The buffer 58 is designed to interface the signal on connection 56 to connection 62 via conventional buffering techniques. A detailed view of the buffer 58 of the preferred embodiment is shown by FIG. 4. In this regard, an operational amplifier 65 is designed to receive the signal on connection 56 at the positive input terminal and to output a signal on connection 62 having the same voltage as the signal on connection 56. Furthermore, a feedback connection 66 preferably couples the output terminal of the operational amplifier 65 with the negative input terminal. Other designs of the buffer 58 may exist without departing from the principles of the present invention.

Figure 5:
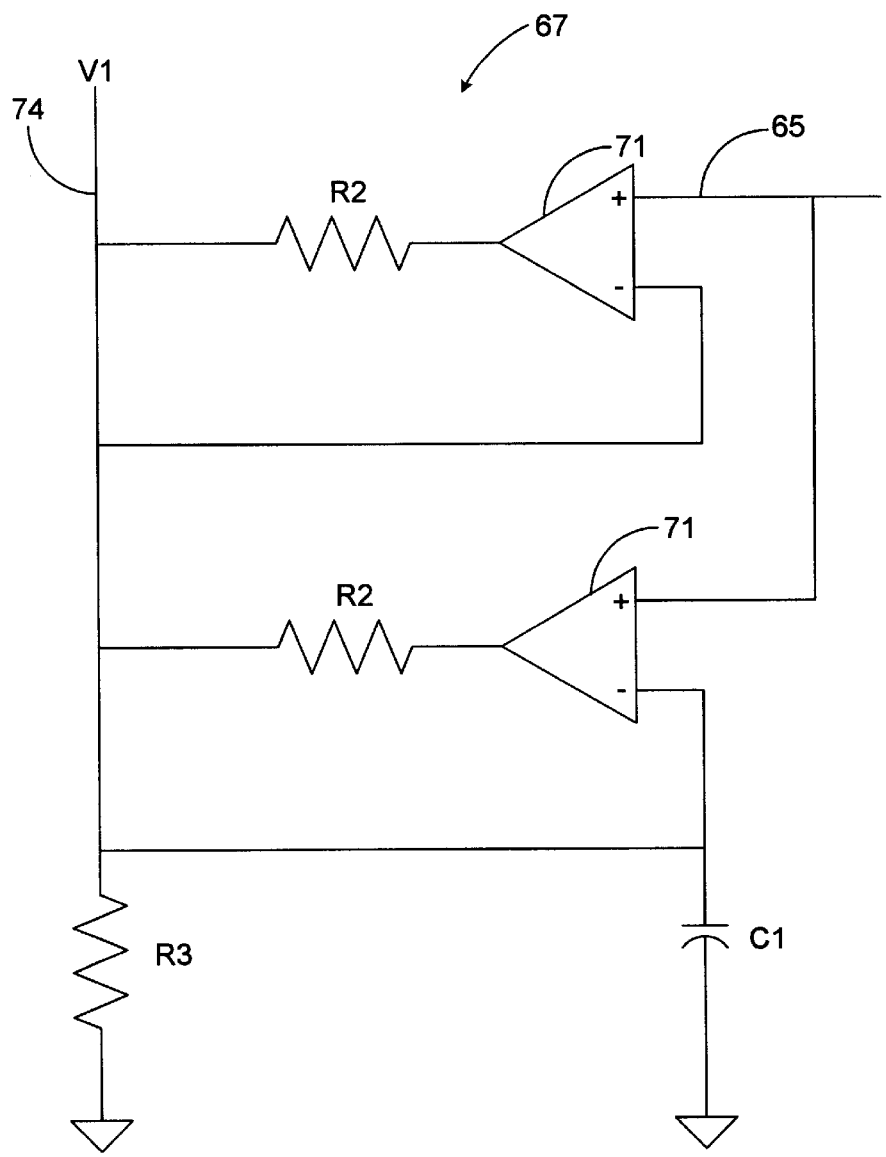
FIG. 5, is a circuit diagram of a current source depicted in FIG. 3.

As shown by FIG. 3, a current source 67 is also coupled to connection 56. Through techniques known in the art, the current source 67 is designed to provide enough current to drive the buffer 58 so that the amount of current drawn from the processing element 16 is minimized. An exemplary design of the current source 67 is shown in FIG. 5. In this regard, the positive input terminal of at least one operational amplifier 71 is coupled to connection 65, as shown by FIG. 5. The output terminal of each operational amplifier 71 is coupled to a connection 74 through a resistor R2. Furthermore, a signal having the same voltage (V1) as the signal on connection 56 is preferably applied to the connection 74. In addition a resistor R3 and a capacitor C1 are coupled to the connection 74 and ground, as shown by FIG. 5, help to stabilize the circuit of the current source 67. As a result of the foregoing configuration, the current source 67 provides sufficient current for driving the buffer 58 without drawing a significant amount of current from the processing element 16. It should be noted that the number of operational amplifiers 71 may vary depending on the amount of current that should be supplied to the buffer 58 by the current source 67.

Referring to FIG. 3, the connection 62 is preferably coupled to an anode end of a diode 76. Furthermore, the cathode end of the diode 76 is preferably coupled to a current sink 79 via connection 81. Therefore, the voltage on connection 81 corresponds to the voltage on connection 62 minus the voltage required to power the diode 76 (i.e., to turn the diode 76 "on"). Consequently, in the preferred embodiment, the voltage at connection 81 corresponds to the operating voltage of core 29 (FIG. 2) minus the voltage drop associated with diode 76. Preferably, the voltage drop across diode 76 is equal to the voltage drop across each of the diodes 84. It should be noted that it may be possible to replace diode 76 with other devices that cause connection 81 to exhibit desired voltage described hereinabove.

The current sink 79 is coupled to the cathode ends of diodes 84 via connections 87, as shown by FIG. 3. The current sink 79 is designed to apply the voltage of connection 81 to each of the connections 87. Therefore, each of the connections 87 preferably has the same voltage as connection 81. The anode end of each of the diodes 84 is preferably coupled to one of the connections 52 such that each connection 52 is coupled to a single diode 84. Therefore, the number of diodes 84 may vary depending on the number of connections 52 that need to be clamped, as will be described in more detail hereinafter.

Figure 6:
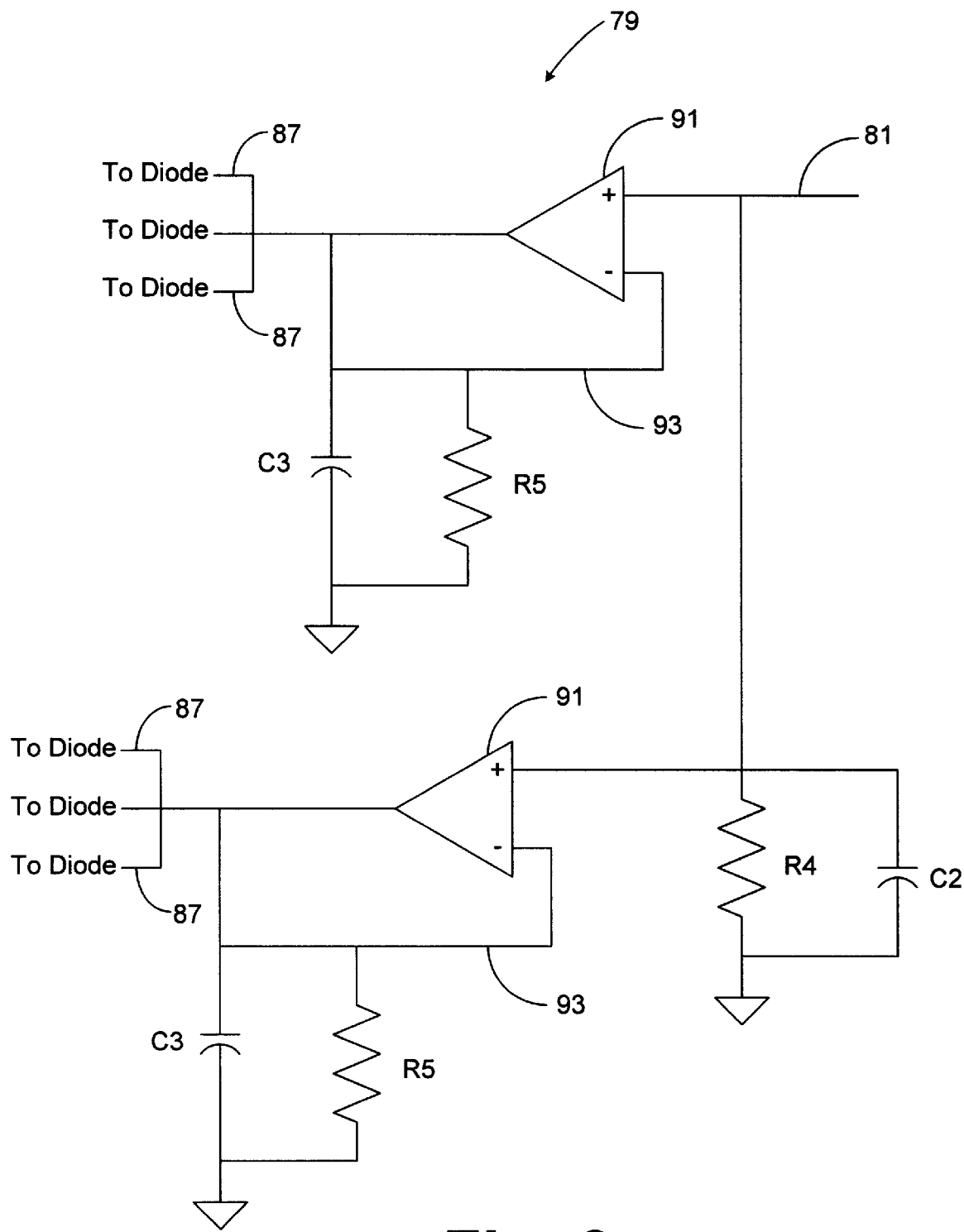
FIG. 6, is a circuit diagram of a current sink depicted in FIG. 3.

The current sink 79 is designed to sink the current that passes through the diodes 84. An exemplary design of the current sink 79 is shown in FIG. 6. In this regard, connection 81 is coupled to the positive input terminal of at least one operational amplifier 91, and each diode 84 is coupled to the output terminal of one of the operational amplifiers 91, as shown by FIGS. 3 and 6. Furthermore, resistor R4 and capacitor C2 are coupled to connection 81 and to ground, and the resistors R5 and capacitors C3 are coupled to each feedback connection 93 and ground, as depicted by FIG. 6. Each feedback connection 93 couples the output terminal of one operational amplifier 91 to the negative input terminal of the operational amplifier 91, as shown by FIG. 6. The configuration of the capacitors C2, C3 and the resistors R4, R5 help to stabilize the circuit of the current sink 79.

Referring to FIG. 3, the system 50 is designed to clamp the voltage of each connection 52 to the operating voltage of the core 29 of processing element 16 (i.e., the voltage of the signals transmitted by connection 56). In this regard, the values of the voltages for connections 87 are equal to the voltage value of the signal being transmitted by connection 56 minus the voltage required to power diode 76, which is equal to the voltage required to power each of the diodes 84. Therefore, when the voltage of any one of the connections 52 exceeds the voltage value of the signal being transmitted by connection 56, the diode 84 connected to the connection 52 saturates. As a result, the voltage on the connection 52 is prevented from exceeding the voltage value of the signal being transmitted by connection 56. Consequently, the voltages of the signals input to the debug port 27 (FIG. 2) should not exceed the operating voltage of the core 29 in the preferred embodiment and are, therefore, compatible with the core 29.

At least one connection 95 is coupled to an output terminal of the debug port 27 (FIG. 2) to enable communication from the processing element 16 to the emulator 14. Therefore, connections 95 transmit signals that are output from the debug port 27. Each of the connections 95 is respectively coupled to a comparator 97, which is designed to determine whether the signal on the connection 95 is a logical high or a logical low. If the signal is a logical high, then the comparator 97 is designed to increase the voltage of the signal before transmitting the signal to connection 101 so that the signal reliably exhibits a logical high, as determined by the emulator 14, after passing through the buffer 21.

Figure 7:
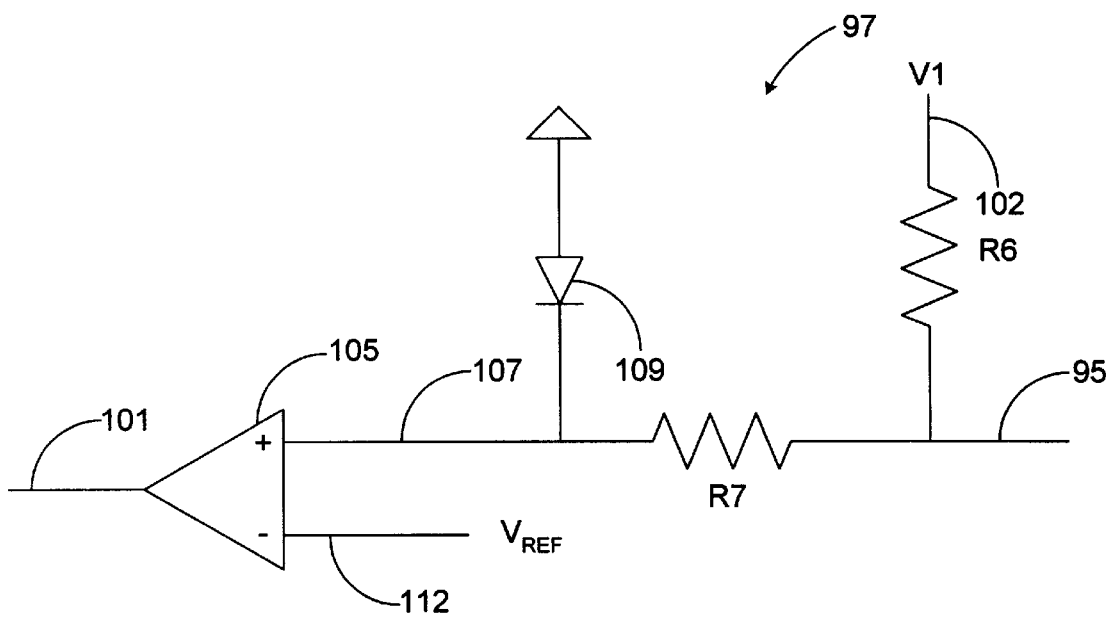
FIG. 7, is a circuit diagram of a comparator depicted in FIG. 3.

An exemplary design of the comparator 97 is shown in FIG. 7. In this regard, a resistor R6 is coupled to connection 95 and to connection 102. A voltage (V1) having a value equal to the voltage of the signal being transmitted on connection 56 (i.e., the operating voltage of the core 29 in the preferred embodiment) is applied to connection 102. Connection 95 is also coupled to the positive input terminal of an operational amplifier 105 via connection 107 and resistor R7. Connection 107 is also coupled to the cathode end of a diode 109, and the anode end of the diode 109 is coupled to ground. The diode 109 protects the operational amplifier 105 by preventing a negative voltage on connection 107 when connection 95 exhibits a negative voltage. The negative input terminal of operational amplifier 105 is coupled to connection 112, which is also connected to voltage divider 115, as shown by FIG. 3. The voltage divider 115, which will be discussed in further detail hereinafter, applies a reference voltage ($V_{ref}$) to connection 112.

Consequently, the operational amplifier 105 amplifies the voltage value of the signal on connection 107 (i.e., the voltage value of the signal on connection 95 output by the debug port 27), if the voltage on the connection 107 exceeds the reference voltage ($V_{ref}$) provided by the voltage divider 115. Therefore, the value of the $V_{ref}$ is preferably selected such that any signal value output by the debug port 27 above $V_{ref}$ should correspond to a logical high and any signal below $V_{ref}$ should correspond to a logical low. It is conventional to establish such a reference value as two thirds of the operating voltage of the core 29. Accordingly, voltage divider 115 is preferably designed to provide a reference voltage on connection 112 having a value of two-thirds the value of the operating voltage of the core 29, although other values of the reference voltage may be selected.

Figure 8:
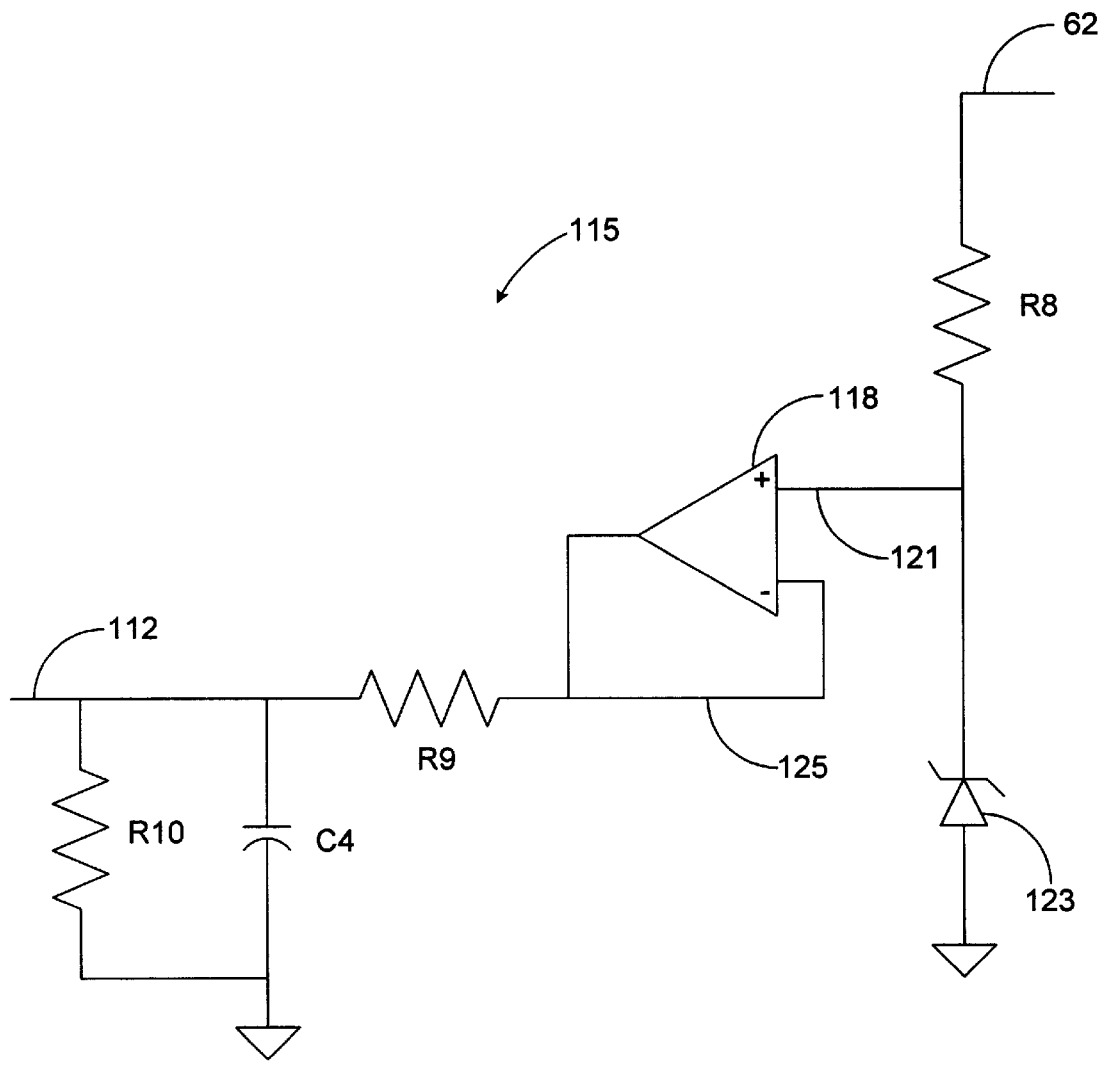
FIG. 8, is a circuit diagram of a voltage divider depicted in FIG. 3.

An exemplary design of the voltage divider 115 is depicted in FIG. 8. Referring to FIG. 8, connection 62 is coupled to a positive input terminal of an operational amplifier 118 via a resistor R8 and connection 121. The connection 121 is preferably coupled to a cathode end of a zener diode 123, which has an analog end coupled to ground. The zener diode 123 ensures that the voltage on connection 121 and, therefore, the voltage ($V_{ref}$) on connection 112 does not exceed TTL voltages. However, the zener diode 123 is optional and does not form a necessary part of the present invention.

The output terminal of the operational amplifier 118 is preferably coupled to connection 112 via resistor R9, and feedback connection 125 couples the output terminal of the operational amplifier 118 to the negative input terminal of the operational amplifier 118. A resistor R10 and capacitor C4 are preferably coupled to connection 112 and ground in parallel as shown by FIG. 8. The capacitor C4 stabilizes the circuit of the voltage divider 115, and the resistors R9 and R10 control the voltage of connection 112. The resistance values of the resistors R9 and R10 should be chosen such that connection 112 exhibits the desired voltage (i.e., two-thirds the value of the operating voltage of the core 29 in the preferred embodiment).

As a result of the configuration of the system 50, as described above, the comparator 97 is designed to amplify the signal output from the processing element 16 on connection 95 when the signal is above the voltage ($V_{ref}$) on connection 112. Therefore, when the signal output by the processing element 16 on connection 95 corresponds to a logical high, the signal is amplified and output by the comparator 97 on connection 101. When the signal output by the processing element 16 on connection 95 corresponds to a logical low, the signal is not amplified but merely passed through the comparator 97 and output on connection 101. The buffer 21 receives the signal on connection 101 and buffers the signal so that the signal may be appropriately interfaced with the emulator 14 via connections 18. Because logical high signals are amplified by the comparator 97, the emulator 14 is able to reliably determine when the processing element 16 outputs a logical high on connection 95 even though the voltage of a logical high signal output by the debug port 27 is lower than standard TTL and CMOS voltages.

The configuration of the system 50 of the preferred embodiment is designed to clamp the voltages of connections 52 at the operating voltage of the core 29 (FIG. 2). In other words, the configuration of the system 50 is designed to prevent the voltages of connections 52 from exceeding the voltage of the signal on connection 56 (i.e., the operating voltage of the core 29 in the preferred embodiment). Therefore, as the operating voltage of the core 29 changes, the value of the voltage clamped at connections 52 also changes, and as a result, the system 50 of the present invention can be utilized with many different operating voltages for the core 29. For example, in the preferred embodiment, the operating voltage of the core 29 is between approximately 0.8 volts and 1.2 volts, although other voltages may be used if desired. Table A depicts values of the components of the system 50 described hereinabove that are sufficient for implementing the preferred embodiment.

TABLE A

| R1  | 51.7 Ohms        |
|-----|------------------|
| R2  | 10 Ohms          |
| R3  | 3160 Ohms        |
| R4  | 1210 Ohms        |
| R5  | 2150 Ohms        |
| R6  | 3160 Ohms        |
| R7  | 24 Ohms          |
| R8  | 6810 Ohms        |
| R9  | 1470 Ohms        |
| R10 | 3160 Ohms        |
| C1  | .01 micro-Farads |
| C2  | .01 micro-Farads |
| C3  | 4.7 micro-Farads |
| C4  | .01 micro-Farads |

It should be noted that other values may be used for the above components without departing from the principles of the present invention. Furthermore, since the operating voltage of the core 29 is relatively low in the preferred embodiment, it is preferable for the voltage drop of the diodes 76 and 84 to be low as well. In this regard, some conventional diodes can be powered with voltages as low as approximately 0.3 volts. It is desirable that these types of diodes be used as diodes 76 and 84 in order to keep the signal-to-noise ratio of the signals on connections 81 and 87 at reasonable levels.

It should be further noted that each operational amplifier 91 in the current sink 79 can only sink a finite amount of current. Therefore, care should be taken to ensure that each operational amplifier 91 is not overloaded. Using the values of the components of the preferred embodiment, each operational amplifier 91 is capable of sinking approximately 100 milli-Amps (mA). Since each connection 87 transmits approximately 26 mA for a high signal when the voltage of high signals on connections 53 is about 2.5V, a maximum of three connections 87 are coupled to each operational amplifier 91. A higher number of connections 87 coupled to each operational amplifier 91 could possibly overload the operational amplifiers 91, in the preferred embodiment.

It should be also noted that the number of diodes 84 coupled to each connection 52 may be changed. However, changing the number of diodes 84 coupled to each connection 52 affects the voltage at which the signals on connections 52 are clamped. As a result, if the configuration of the diodes 84 is changed, a corresponding change to the diode 76 should occur such that the voltage on each connection 87 corresponds to the correct voltage that will clamp the voltage on the connections 52 at the desired voltage.

In addition, the emulator 14 may be replaced with another type of device without departing from the principles of the present invention, and the system may interface signals with other portions of the processing element 16 without departing from the principals of the present invention. Therefore, the emulator 14 and the interfacing of signals to the debug port 27 of the processing element 16 do not form necessary parts of the invention.

OPERATION

The preferred use and operation of the preferred embodiment of the system 50 and associated methodology are described hereafter.

In the preferred embodiment, the emulator 14 operates at a relatively high voltage (e.g., 5 volts) and transmits signals at this relatively high voltage through buffer 21 to processing element 16. The core 29 (FIG. 2) of the processing element 16 operates at a relatively low voltage (e.g., 0.8 volts), and the voltage of the signals transmitted by the emulator 14 should be reduced before the signals are received by the debug port 27 (FIG. 2). To help dissipate power, the buffer 21 preferably reduces the voltage of the signals transmitted by the emulator 14 as much as possible (without reducing the voltage below the operating voltage of the core 29) before transmitting the signals across connections 53. However, reduction of the voltage of the signals by the buffer 21 is not a necessary feature of the present invention.

The signals on connections 53 pass through resistors R1 and then through connections 52. Because of the resistors R1, the voltages of the signals on connections 52 can be different than the voltages of the signals on connections 53. The voltages of the signals on connections 52 are prevented from exceeding the operating voltage of the core 29. In this regard, the processing element 16 of the preferred embodiment continuously transmits a signal on connection 56 having a voltage equal to the operating voltage of the core 29 (e.g., approximately 0.8 volts in the preferred embodiment). This voltage passes through buffer 58, diode 76 and current sink 79 such that the voltages of connections 87 are equal to the operating voltage of the core 29 minus the voltage drop across the diode 76.

The current source 67 drives the buffer 58 such that a significant amount of current is not drawn from the processing element 16 by the buffer 58. Because the voltages of connections 87 correspond to the operating voltage of the core 29 minus the voltage drop across diode 76, the diodes 84 saturate when the voltage of connections 52 exceeds the operating voltage of the core 29. Therefore, sufficient current flows through the diodes 84 and into the current sink 79 to keep the voltage of the connections 52 at or below the operating voltage of the core 29. Consequently, the signals on the connections 52 are transmitted into the debug port 27 (FIG. 2) at voltages compatible with the core 29.

It should be noted that the voltage of the signals on connection 56 and, therefore, on connections 87 can be less than the voltages described hereinbefore for the preferred embodiment. However, this would result in the system 50 clamping the voltages on connections 52 at values less than the value of the operating voltage of the core 29. Such a result is generally undesirable since it decreases the signal-to-noise ratio of the signals transmitted across connections 52.

The core 29 (FIG. 2) transmits signals to the emulator 14 via connections 95. Since logical high values output by the core 29 have voltages that correspond to the operating voltage of the core 29 (i.e., approximately 0.8 volts in the preferred embodiment), the logical high values should be amplified so that the logical high values can be properly identified after passing through buffer 21 and into emulator 14. Therefore, the comparator 97 compares the output signals on connection 95 to a reference voltage ($V_{ref}$) supplied by the voltage divider 115. When an output signal of any of the connections 95 has a voltage value above the value of the reference voltage, the output signal is amplified by one of the comparators 97 and transmitted across one of the connections 101. When the value of the output signal is below the value of the reference voltage, the signal is transmitted across one of the connections 101 without amplification.

Although other devices and/or methods may be used to supply the reference voltage, the voltage divider 115 preferably receives a signal having a voltage equal to the voltage of the signal on connection 56. The voltage divider 115, through known techniques, then reduces the voltage value of this signal to a particular value. The particular value should be selected such that signals received by the comparators 97 from connections 95 having voltage values above the particular value are considered high and signals received by the comparators 97 from connections 95 having voltage values below the particular value are considered low. Pursuant to conventional standards, the particular value of the preferred embodiment is selected as two-thirds of the operating voltage value of the core 29.

The buffer 21 receives the signals transmitted across connections 101 and transmits these signals to the emulator 14 via connections 18. The buffer 21 may amplify the values of the signals received from connections 101 before transmitting the signals across connections 18, if desired.

In concluding the detailed description, it should be noted that it will be obvious to those skilled in the art that many variations and modifications may be made to the preferred embodiment without substantially departing from the principles of the present invention. All such variations and modifications are intended to be included herein within the scope of the present invention as set forth in the following claims.

Now, therefore, the following is claimed:

1. A system for interfacing signals, comprising:
   a first connection;
   a resistive device coupled to said first connection;
   a current sink;
   a first diode having an anode end and a cathode end, said cathode end of said first diode coupled to said current sink and said anode end of said first diode coupled to said first connection;
   a buffer; and
   a second diode having an anode end and a cathode end, said anode end of said second diode coupled to said buffer and said cathode end of said second diode coupled to said current sink.

2. The system of claim 1, wherein said buffer transmits a signal having a first voltage, and wherein a voltage of said first connection is prevented from exceeding said first voltage by transmitting current from said first connection to said current sink through said first diode.

3. The system of claim 1, further comprising:
   a second connection;
   a voltage divider coupled said buffer, said voltage divider configured to receive a voltage signal and to produce a reference voltage signal based on said received voltage signal; and
   a comparator coupled to said second connection and to said voltage divider, said comparator configured to amplify a signal received from said second connection based on a value of said signal received from said second connection and based on a value of said reference voltage signal.

4. The system of claim 3, further comprising a current source coupled to said buffer.

5. The system of claim 1, further comprising:
   a processing element associated with an operating voltage, said processing element coupled to said first connection and to said buffer, said processing element transmitting to said buffer a signal having a voltage value corresponding with a value of said operating voltage,
   wherein said first diode is coupled to said first connection at a point on said first connection between said resistive device and said processing element.

6. The system of claim 5, further comprising:

a second buffer coupled to said resistive device; and an emulator coupled to said second buffer.

7. The system of claim 1, wherein said current sink further comprises:

an operational amplifier having a first input terminal, a second input terminal, and an output terminal, said first input terminal coupled to said cathode end of said second diode, said second input terminal coupled said output terminal, said output terminal coupled to said cathode end of said first diode.

8. The system of claim 7, wherein said system further comprises:

a processing element coupled to said first connection;

a second buffer coupled to said resistive device; and an emulator coupled to said second buffer.

9. The system of claim 7, further comprising:

a second connection;

a second resistive device coupled to said second connection; and a third diode having an anode end and a cathode end, said cathode end of said third diode coupled to said current sink and said anode end of said third diode coupled to said second connection, wherein said current sink further comprises a second operational amplifier having a third input terminal, a fourth input terminal, and a second output terminal, said third input terminal coupled to said cathode end of said second diode, said fourth input terminal coupled to said second output terminal, said second output terminal coupled to said cathode end of said third diode.

10. The system of claim 7, wherein said current sink further comprises:

a third resistive device coupled to said second input terminal and to ground;

a first capacitance device coupled to said second input terminal and to said ground;

a fourth resistive device coupled to said first input terminal and to said ground; and a second capacitance device coupled to said first input terminal and to said ground.

11. The system of claim 7, further comprising:

a processing element, wherein said buffer further comprises a second operational amplifier having a third input terminal, a fourth input terminal, and a second output terminal, said third input terminal coupled to said processing element, said fourth input terminal coupled to said second output terminal, and said second output terminal coupled to said anode end of said second diode.

12. A system for interfacing signals with processing elements, comprising:

a processing element;

a first connection coupled to said processing element;

a resistive device coupled to said first connection;

a first diode having an anode end and a cathode end, said anode end of said first diode coupled to said first connection between said resistive device and said processing element;

means for buffering a signal transmitted from said processing element, said signal having a first voltage value;

means for adjusting said first voltage value to a second voltage value; and means for maintaining a voltage value of said cathode end of said first diode at said second voltage value such that voltage values of signals on said first connection are prevented from exceeding said first voltage value, said maintaining means coupled to said cathode end of said first diode.

13. The system of claim 12, wherein said first voltage value is less than approximately 2.5 volts.

14. The system of claim 12, wherein said adjusting means includes a second diode having an anode end and a cathode end, said anode end of said second diode coupled to said buffering means and said cathode end of said second diode coupled to said maintaining means.

15. The system of claim 12, further comprising:

a second connection coupled to said processing element;

means for amplifying signals on said second connection when said signals on said second connection have voltage values exceeding a threshold value; and means for determining said threshold value based on said first voltage value.

16. The system of claim 12, further comprising a means for sourcing current to said buffering means.

17. The system of claim 12, further comprising an emulator coupled to said resistive device.

18. The system of claim 12, wherein said maintaining means includes:

an operational amplifier having a first input terminal, a second input terminal, and an output terminal, said first input terminal coupled to said adjusting means, said second input terminal coupled to said output terminal, said output terminal coupled to said cathode end of said first diode.

19. A method for interfacing signals, comprising the steps of:

(a) establishing a threshold voltage;

(b) transmitting a first signal across a first connection;

(c) preventing a first voltage of said first signal from exceeding said threshold voltage when said first signal is being transmitted across said first connection, said preventing step including the steps of:

(1) passing current associated with said first signal through a first diode;

(2) dissipating said current;

(3) transmitting a second signal having a voltage corresponding to said threshold voltage through a second diode; and (4) establishing a voltage of a cathode end of said first diode via said second signal after transmitting said second signal through said second diode.

20. The method of claim 19, wherein said dissipating step includes the steps of:

(A) transmitting said current to an output terminal of an operational amplifier;

(B) transmitting said second signal to a first input terminal of said operational amplifier; and (C) transmitting a feedback signal to a second input terminal of said operational amplifier.

21. The method of claim 19, further comprising the steps of:

(d) transmitting a third signal across a second connection;

(e) providing a reference voltage based on said threshold voltage;

(f) determining whether a voltage of said third signal exceeds said reference voltage; and (g) amplifying said third signal when said voltage of said third signal exceeds said reference voltage.

* * * * *